US011955587B2

(12) United States Patent
Li et al.

(10) Patent No.: US 11,955,587 B2
(45) Date of Patent: Apr. 9, 2024

(54) LIGHT EMITTING DIODE PACKAGE STRUCTURE AND MANUFACTURING METHOD THEREOF AND MANUFACTURING METHOD OF DISPLAY DEVICE

(71) Applicant: Unimicron Technology Corp., Taoyuan (TW)

(72) Inventors: Jeng-Ting Li, Pingtung County (TW); Chi-Hai Kuo, Taoyuan (TW); Cheng-Ta Ko, Taipei (TW); Pu-Ju Lin, Hsinchu (TW)

(73) Assignee: Unimicron Technology Corp., Taoyuan (TW)

( * ) Notice: Subject to any disclaimer, the term of this patent is extended or adjusted under 35 U.S.C. 154(b) by 459 days.

(21) Appl. No.: 17/227,391

(22) Filed: Apr. 12, 2021

(65) Prior Publication Data
US 2022/0271208 A1    Aug. 25, 2022

(30) Foreign Application Priority Data

Feb. 22, 2021   (TW) .................................. 110106107

(51) Int. Cl.
*H01L 33/62*  (2010.01)
*H01L 27/15*  (2006.01)
*H01L 33/00*  (2010.01)

(52) U.S. Cl.
CPC ............ *H01L 33/62* (2013.01); *H01L 27/156* (2013.01); *H01L 33/005* (2013.01); *H01L 2933/0066* (2013.01)

(58) Field of Classification Search
CPC ...... H01L 33/62; H01L 27/156; H01L 33/005; H01L 2933/0066; H01L 25/0753; H01L 25/167

See application file for complete search history.

(56) References Cited

U.S. PATENT DOCUMENTS

| 6,768,064 | B2 | 7/2004 | Higuchi et al. |
| 2019/0296102 | A1* | 9/2019 | Tain ...................... H01L 28/40 |
| 2020/0075564 | A1* | 3/2020 | Lin ........................ H01L 24/83 |
| 2020/0328266 | A1 | 10/2020 | Liu et al. |

* cited by examiner

*Primary Examiner* — Ratisha Mehta
(74) *Attorney, Agent, or Firm* — JCIPRNET

(57) ABSTRACT

A light emitting diode (LED) package structure includes a glass substrate, conductive through holes, active elements, an insulating layer, LEDs and pads. The glass substrate has an upper surface and a lower surface. The conductive through holes penetrate the glass substrate and connect the upper and the lower surfaces. The active elements are disposed on the upper surface of the glass substrate and electrically connected to the conductive through holes. The insulating layer is disposed on the upper surface and covers the active elements. The LEDs are disposed on the insulating layer and electrically connected to at least one of the active elements. The pads are disposed on the lower surface of the glass substrate and electrically connected to the conductive through holes. A source of at least one active elements is directly electrically connected to at least one of the corresponding pads through the corresponding conductive through hole.

20 Claims, 12 Drawing Sheets

LIGHT EMITTING DIODE PACKAGE STRUCTURE AND MANUFACTURING METHOD THEREOF AND MANUFACTURING METHOD OF DISPLAY DEVICE

CROSS-REFERENCE TO RELATED APPLICATION

This application claims the priority benefit of Taiwan application serial no. 110106107, filed on Feb. 22, 2021. The entirety of the above-mentioned patent application is hereby incorporated by reference herein and made a part of this specification.

BACKGROUND OF THE INVENTION

Technical Field

The disclosure relates to a package structure and manufacturing method thereof, and particularly relates to a light emitting diode package structure and manufacturing method thereof and a manufacturing method of display device having such light emitting diode package structure.

Description of Related Art

The current assembly method of active micro light emitting diode displays is to first transfer micro light emitting diodes to the substrate of a large-sized thin film transistor (TFT) by means of a mass transfer, and then to splice the entire structure onto the circuit board so as to complete the manufacturing of the display device. However, the above assembly method faces many problems, including: 1.) large-sized thin film transistor substrates have larger warp, so when spliced onto the circuit board, they are prone to warpages, which makes the post-packaging process more difficult; 2.) in case of thin film transistors on large-sized thin film transistor substrates that need to be repaired, it is very difficult to repair them because the micro light emitting diodes have been transferred thereto by mass transfer; 3.) Thin-film transistor substrates are based on glass, therefore external circuits or electronic components cannot be directly soldered on their back sides. Due to the above three factors, not only is the manufacturing yield rate of active micro light emitting diode displays reduced, but also the difficulty of manufacturing large-sized, high-unit pixel displays is increased.

SUMMARY OF THE INVENTION

The disclosure provides a light emitting diode package structure and manufacturing method thereof, in which active elements and pads located on opposite surfaces of the glass substrate are connected through the conductive through holes penetrating the glass substrate, and other external circuits or electronic components can be directly soldered thereto through the pads located under the glass substrate.

The disclosure also provides a manufacturing method of display device, including the light emitting diode package structure, which can solve existing problems and has better structure reliability.

A light emitting diode package structure of the disclosure includes a glass substrate, multiple conductive through holes, multiple active elements, an insulating layer, multiple light emitting diodes, and multiple pads. A glass substrate has an upper surface and a lower surface opposite to each other. Multiple conductive through holes penetrate the glass substrate and connect the upper surface and the lower surface. Multiple active elements are disposed on the upper surface of the glass substrate and electrically connected to the multiple conductive through holes. An insulating layer is disposed on the upper surface of the glass substrate and covers the multiple active elements. Multiple light emitting diodes are disposed on the insulating layer and electrically connected to at least one of the multiple active elements. Multiple pads are disposed on the lower surface of the glass substrate and electrically connected to the multiple conductive through holes. A source of the at least one of the multiple active elements is electrically connected to at least one of the multiple corresponding pads directly through the corresponding conductive through hole.

In an embodiment of the disclosure, each of the multiple active elements includes: a gate, a source, a gate insulating layer, an active layer, and a drain. A gate is disposed on the upper surface of the glass substrate. The source is formed on the upper surface of the glass substrate, where the gate and the source belong to a same layer. A gate insulating layer is disposed on the upper surface of the glass substrate and covers the gate. An active layer is disposed on the upper surface of the glass substrate and covers the gate insulating layer and part of the source. A drain is disposed on the active layer, where the multiple light emitting diodes are electrically connected, respectively, to the drain of each of the multiple active elements.

In an embodiment of the disclosure, the multiple pads are electrically connected to the source and the gate of each of the multiple active elements through the multiple conductive through holes.

In an embodiment of the disclosure, the light emitting diode package structure further includes: a reconfiguration circuit layer disposed on the lower surface of the glass substrate and including at least one reconfiguration circuit, the multiple conductive holes, and the multiple pads. The multiple conductive holes connect the at least one reconfiguration circuit and the multiple conductive through holes and connect the at least one reconfiguration circuit and the multiple pads. The gate of each of the multiple active elements is electrically connected to the multiple pads of the reconfiguration circuit layer through the multiple conductive through holes.

In an embodiment of the disclosure, the light emitting diode package structure further includes a patterned circuit layer and multiple conductive holes. A patterned circuit layer is disposed on the insulating layer. Multiple conductive holes are disposed in the insulating layer and electrically connect the patterned circuit layer and the drain of each of the multiple active elements. The multiple light emitting diodes are electrically connected, respectively, to the multiple active elements through the patterned circuit layer and the multiple conductive holes.

In an embodiment of the disclosure, the multiple active elements include a first active element and a second active element. The first active element includes a first gate, a first source, a first active layer, a first gate insulating layer, and a first drain. The first gate, the first source, the first active layer, and the first gate insulating layer are disposed on the upper surface of the glass substrate. The first gate and the first source belong to a same layer. The first gate insulating layer covers the first gate. The first active layer covers the first gate insulating layer and part of the first source. The first drain is disposed on the first active layer. The second active element includes a second gate, the source, a second active layer, a second gate insulating layer, and a second drain. The second gate, the source, the second active layer, the second gate insulating layer, and the second drain are disposed on the upper surface of the glass substrate. The second gate, the source, and the second drain belong to a same layer. The second gate insulating layer covers the second gate. The second active layer covers the second gate insulating layer, part of the source, and part of the second drain. The multiple conductive through holes are electrically connected to the first gate of the first active element, the second gate of the second active element, the source, and the second drain.

In an embodiment of the disclosure, the light emitting diode package structure further includes a first reconfiguration circuit layer disposed on the insulating layer. The multiple light emitting diodes are electrically connected to the first drain of the first active element through the first reconfiguration circuit layer.

In an embodiment of the disclosure, the light emitting diode package structure further includes a second reconfiguration circuit layer disposed on the lower surface of the glass substrate and including the at least one reconfiguration circuit, multiple conductive holes, and the multiple pads. The multiple conductive holes connecting the at least one reconfiguration circuit and the multiple conductive through holes and connecting the at least one reconfiguration circuit and the multiple pads. The second gate of the second active element and the source are electrically connected to the multiple pads of the second reconfiguration circuit layer through the multiple conductive through holes.

In an embodiment of the disclosure, the light emitting diode package structure further includes a passive element embedded in the second reconfiguration circuit layer. The multiple conductive through holes connect the first gate of the first active element and connect the second drain of the second active element are electrically connected to the passive element.

A manufacturing method of light emitting diode package structure includes the following steps. A glass substrate is provided. The glass substrate has an upper surface and a lower surface opposite to each other. Multiple conductive through holes are formed penetrating the glass substrate. The multiple conductive through holes connect the upper surface and the lower surface. Multiple active elements are formed on the upper surface of the glass substrate. The multiple active elements are electrically connected to the multiple conductive through holes. An insulating layer is formed on the upper surface of the glass substrate, the insulating layer covering the multiple active elements. Multiple light emitting diodes are bonded on the insulating layer. The multiple light emitting diodes are electrically connected to at least one of the multiple active elements. Multiple pads are formed on the lower surface of the glass substrate, and the multiple pads are electrically connected to the multiple conductive through holes. A source of the at least one of the multiple active elements is electrically connected to at least one of the multiple corresponding pads directly through the corresponding conductive through hole.

In an embodiment of the disclosure, steps of forming each of the multiple active elements on the upper surface of the glass substrate include the following. A gate and the source are formed on the upper surface of the glass substrate, where the gate and the source belong to a same layer. A gate insulating layer is formed on the upper surface of the glass substrate, the gate insulating layer covering the gate. An active layer is formed on the upper surface of the glass substrate, the active layer covering the gate insulating layer and part of the source. A drain is formed on the active layer, where the multiple light emitting diodes are electrically connected, respectively, to the drain of each of the multiple active elements.

In an embodiment of the disclosure, the multiple pads are formed on the lower surface of the glass substrate at the same time when forming the gate and the source. The multiple pads are electrically connected to the source and the gate of each of the multiple active elements through the multiple conductive through holes.

In an embodiment of the disclosure, the manufacturing method of light emitting diode package structure further includes forming a reconfiguration circuit layer on the lower surface of the glass substrate. The reconfiguration circuit layer includes at least one reconfiguration circuit, multiple conductive holes, and the multiple pads. The multiple conductive holes connect the at least one reconfiguration circuit and the multiple conductive through holes and connect the at least one reconfiguration circuit and the multiple pads. The gate of each of the multiple active elements is electrically connected to the multiple pads of the reconfiguration circuit layer through the multiple conductive through holes.

In an embodiment of the disclosure, after forming the insulating layer and before providing the light emitting diodes further includes forming a patterned circuit layer and multiple conductive holes. The patterned circuit layer is disposed on the insulating layer, and the multiple conductive holes are disposed in the insulating layer and electrically connect the patterned circuit layer and the drain of each of the multiple active elements. The multiple light emitting diodes are electrically connected, respectively, to the multiple active elements through the patterned circuit layer and the multiple conductive holes.

In an embodiment of the disclosure, the multiple active elements include a first active element and a second active element. The first active element includes a first gate, a first source, a first active layer, a first gate insulating layer, and a first drain. The first gate, the first source, the first active layer, and the first gate insulating layer are disposed on the upper surface of the glass substrate. The first gate and the first source belong to a same layer. The first gate insulating layer covers the first gate, the first active layer covers the first gate insulating layer and part of the first source, and the first drain is disposed on the first active layer. The second active element includes a second gate, the source, a second active layer, a second gate insulating layer, and a second drain. The second gate, the source, the second active layer, the second gate insulating layer, and the second drain are disposed on the upper surface of the glass substrate. The second gate, the source, and the second drain belong to a same layer.

The second gate insulating layer covers the second gate, and the second active layer covers the second gate insulating layer, part of the source, and part of the second drain. The multiple conductive through holes are electrically connected to the first gate of the first active element, the second gate of the second active element, the source, and the second drain.

In an embodiment of the disclosure, the manufacturing method of light emitting diode package structure further includes forming a first reconfiguration circuit layer on the insulating layer after forming the insulating layer and before providing the multiple light emitting diodes. The multiple light emitting diodes are electrically connected to the first drain of the first active element through the first reconfiguration circuit layer.

In an embodiment of the disclosure, the manufacturing method of light emitting diode package structure further includes forming a second reconfiguration circuit layer on the lower surface of the glass substrate. The second reconfiguration circuit layer includes at least one reconfiguration circuit, multiple conductive holes, and the multiple pads. The multiple conductive holes connect the at least one reconfiguration circuit and the multiple conductive through holes and connect the at least one reconfiguration circuit and the multiple pads. The second gate of the second active element and the source are electrically connected to the multiple pads of the second reconfiguration circuit layer through the multiple conductive through holes.

In an embodiment of the disclosure, the manufacturing method of light emitting diode package structure further includes embedding a passive element in the second reconfiguration circuit layer. The multiple conductive through holes connecting the first gate of the first active element and connecting the second drain of the second active element are electrically connected to the passive element.

A manufacturing method of display device includes the following steps. A carrier board is provided. A light emitting diode package structure is provided. The light emitting diode package structure includes a glass substrate, multiple conductive through holes, multiple active elements, an insulating layer, multiple light emitting diodes, and multiple pads. The glass substrate has an upper surface and a lower surface opposite to each other. Multiple conductive through holes penetrate the glass substrate and connect the upper surface and the lower surface. Multiple active elements are disposed on the upper surface of the glass substrate and electrically connected to the multiple conductive through holes. An insulating layer is disposed on the upper surface of the glass substrate and covers the multiple active elements. Multiple light emitting diodes are disposed on the insulating layer and electrically connected to at least one of the multiple active elements. Multiple pads are disposed on the lower surface of the glass substrate and electrically connected to the multiple conductive through holes. A source of the at least one of the multiple active elements is electrically connected to at least one of the multiple corresponding pads directly through the corresponding conductive through hole. Multiple independent light emitting diode package units are formed by singulating the light emitting diode package structure. The multiple light emitting diode package units are assembled on the carrier board so as to form a display device, where each of the multiple light emitting diode package units is directly electrically connected to the carrier board through the multiple pads.

In an embodiment of the disclosure, the number of the multiple light emitting diodes in each of the multiple light emitting diode package units is three. The multiple light emitting diodes are a red micro light emitting diode, a green micro light emitting diode, and a blue micro light emitting diode.

Based on the above, in the light emitting diode package structure and manufacturing method thereof according to the disclosure, the multiple conductive through holes penetrate the glass substrate and electrically connect the multiple active elements on the upper surface and the multiple pads on the lower surface, where the source of at least one of the multiple active elements is electrically connected to the multiple corresponding pads directly through the corresponding conductive through hole, and the multiple light emitting diodes are electrically connected to the multiple active elements. In this way, the multiple independent light emitting diode package units are formed having the multiple pads by subsequently singulating the light emitting diode package structure. Also, each of the multiple light emitting diode package units is directly electrically connected to the carrier board through the multiple pads, so as to complete the manufacturing of the display device. Compared with the conventional technology in which a large-sized thin-film transistor substrate and the micro light emitting diodes transferred thereon by mass transfer are spliced onto the circuit board, in the disclosure, the singulated small-sized light emitting diode package unit is spliced to the carrier board, therefore there is no problem of substrate warping. In addition, if there is damage and need to be repaired, the damaged light emitting diode package unit can be directly replaced with a good light emitting diode package unit, which is a relatively simple process, and the manufacturing cost can be reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the exemplary embodiments of the disclosure, examples of which are illustrated in the accompanying drawings.

FIG. 1A to FIG. 1I are cross-sectional diagrams of a manufacturing method of light emitting diode package structure according to an embodiment of the disclosure. Please refer to FIG. 1A for the manufacturing method of light emitting diode package structure of the present embodiment. First, a glass substrate 110 is provided. The glass substrate 110 has an upper surface 111 and a lower surface 113 opposite to each other. Here, the glass substrate 110 further has multiple through holes T, where the through holes T penetrate the glass substrate 110 and connect the upper surface 111 and the lower surface 113.

Figure 1A:
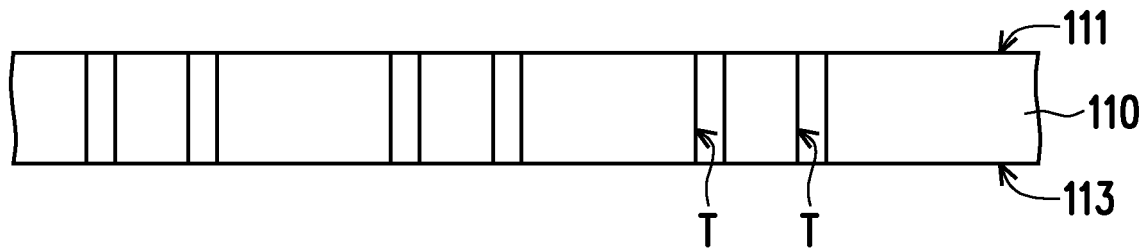
FIG. 1A to FIG. 1I are schematic cross-sectional diagrams of a manufacturing method of light emitting diode package structure according to an embodiment of the disclosure.
Figure 1B:
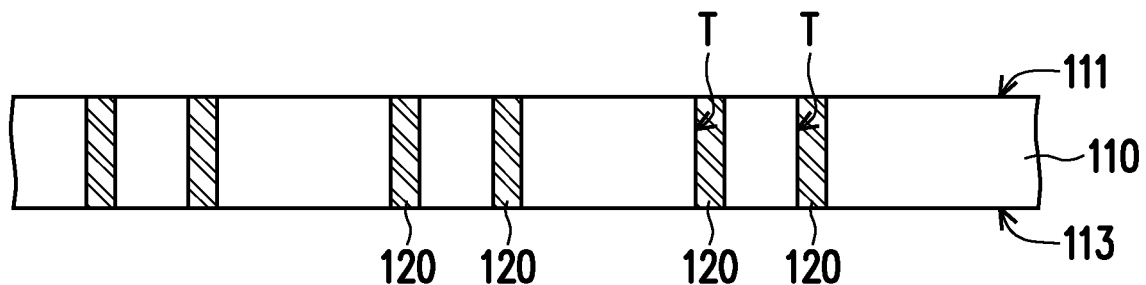
Figure 1C:
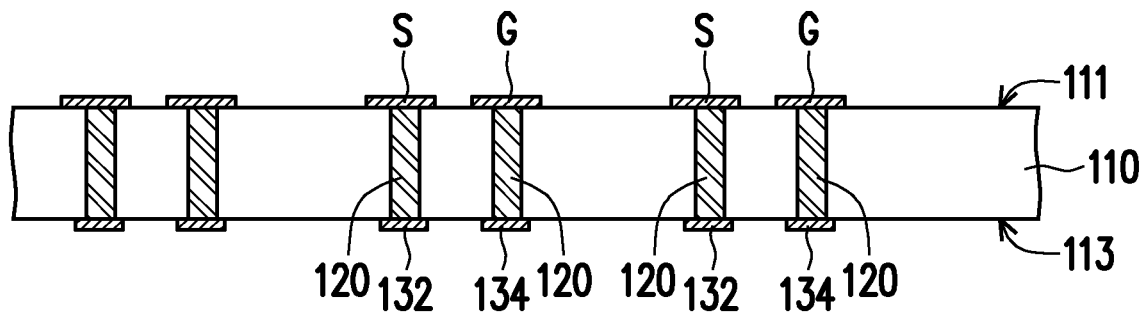

Next, with reference to FIG. 1B, conductive material is electroplated on the multiple through holes T to form multiple conductive through holes 120 penetrating through the glass substrate 110, where the conductive through holes 120 connect the upper surface 111 and the lower surface 113 of the glass substrate 110.

Figure 1D:
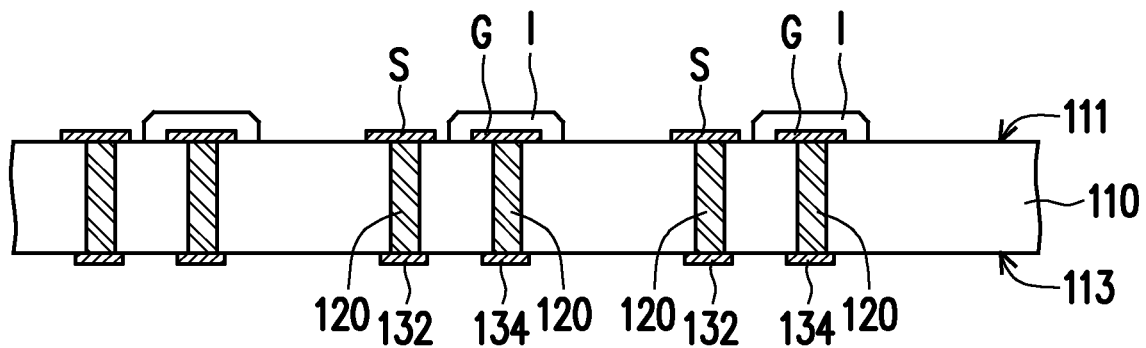
Figure 1E:
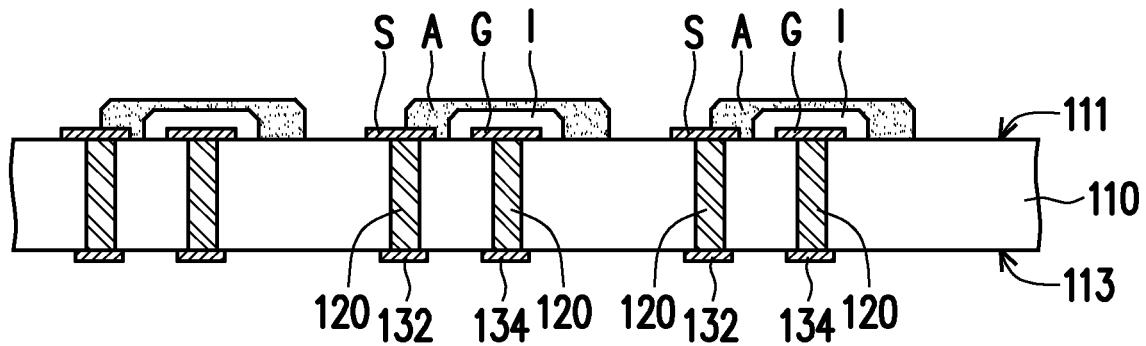
Figure 1F:
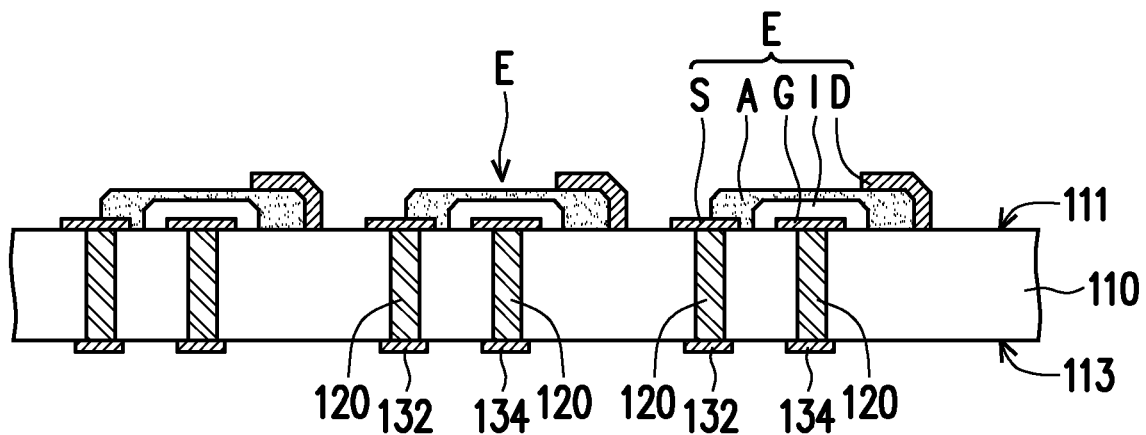

Next, referring to FIG. 1F, multiple active elements E are formed on the upper surface 111 of the glass substrate 110, where the active elements E are electrically connected to the conductive through holes 120. Specifically, for steps of forming of the active element E, referring to FIG. 1C, first a gate G and a source S are formed on the upper surface 111 of the glass substrate 110, where the gate G and the source S belong to the same layer. When forming the gate G and the source S, multiple pads 132 and multiple pads 134 are formed on the lower surface 113 of the glass substrate 110 at the same time, where the pads 132 and the pads 134 are electrically connected to the conductive through holes 120, respectively. Here, the pads 132 and the pads 134 are electrically connected to the source S and the gate G of each active element E (referring to FIG. 1F) through the conductive through holes 120.

Next, referring to FIG. 1D, a gate insulating layer I is formed on the upper surface 111 of the glass substrate 110, where the gate insulating layer I covers the gate G and part of the upper surface 111. Next, referring to FIG. 1E, an active layer A is formed on the upper surface 111 of the glass substrate 110, where the active layer A covers the gate insulating layer I, part of the source S, and part of the upper surface 111. Next, referring to FIG. 1F, a drain D is formed on the active layer A. So far, the manufacturing of the active elements E has been completed, where the active element E is, for example, a thin film transistor.

Figure 1G:
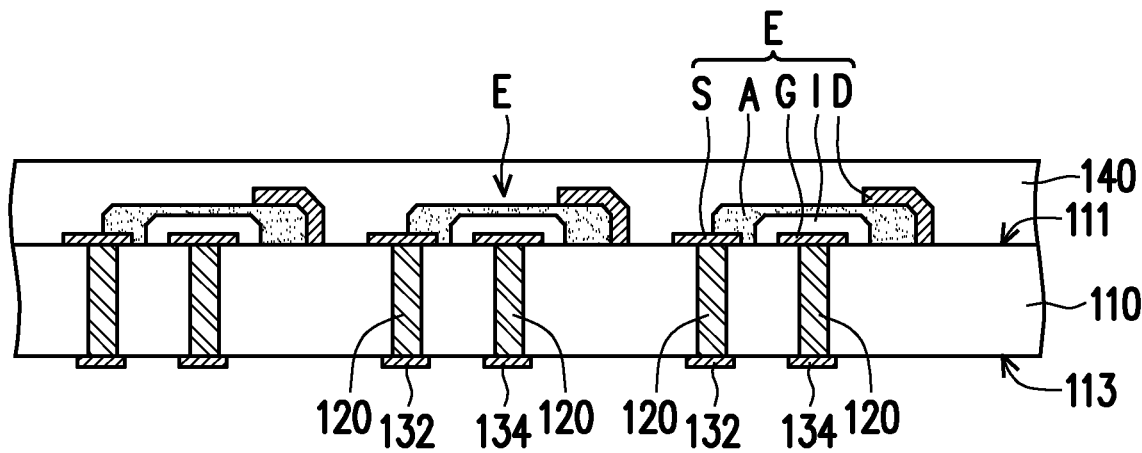

Next, referring to FIG. 1G, an insulating layer 140 is formed on the upper surface 111 of the glass substrate 110, where the insulating layer 140 covers the active elements E and the upper surface 111 of the glass substrate 110.

Figure 1H:
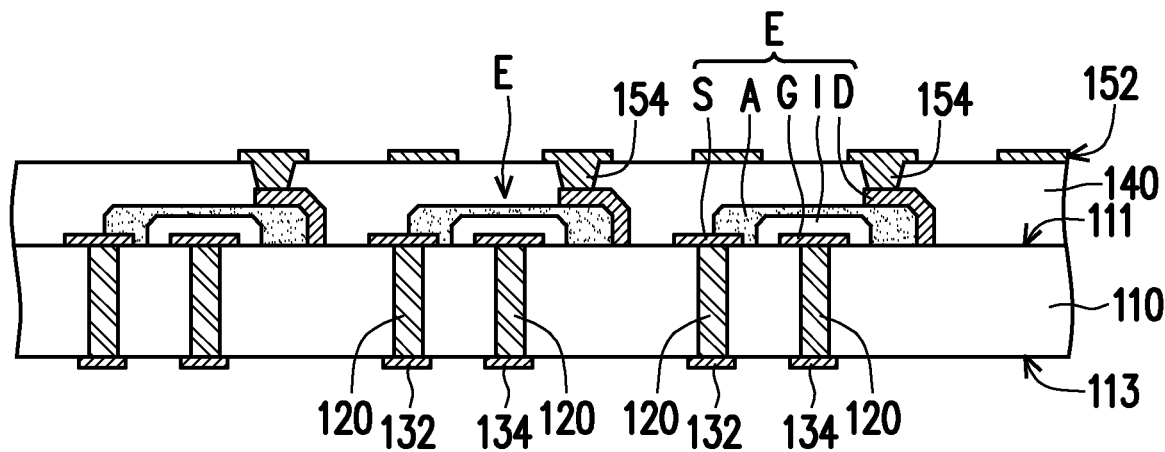

After that, referring to FIG. 1H, a patterned circuit layer 152 and multiple conductive holes 154 are formed, where the patterned circuit layer 152 is disposed on the insulating layer 140, and the conductive holes 154 are disposed in the insulating layer 140 and electrically connect the patterned circuit layer 152 and the drain D of each active element E.

Figure 1I:
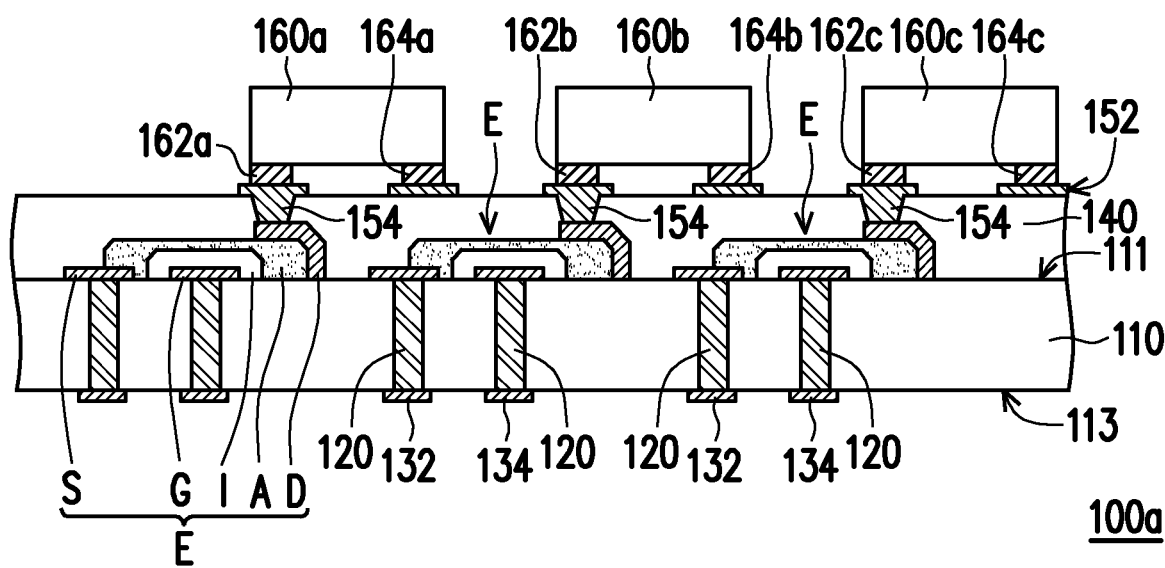

Finally, referring to FIG. 1I, a light emitting diode 160a, a light emitting diode 160b, and a light emitting diode 160c are bonded on the insulating layer 140 by mass transfer, where the light emitting diode 160a is electrically connected to the patterned circuit layer 152 through a pad 162a and a pad 164a, the light emitting diode 160b is electrically connected to the patterned circuit layer 152 through a pad 162b and a pad 164b, and the light emitting diode 160c is electrically connected to the patterned circuit layer 152 through a pad 162c and a pad 64c. Here, the light emitting diode 160a, the light emitting diode 160b, and the light emitting diode 160c are electrically connected to the drain D of the active element E through the pad 162a, the pad 162b, the pad 162c, and the conductive holes 154, respectively. That is, the light emitting diode 160a, the light emitting diode 160b, and the light emitting diode 160c are electrically connected to the active elements E through the patterned circuit layer 152 and the conductive holes 154, respectively. Further, the pad 164a, the pad 164b, and the pad 164c of the light emitting diode 160a, the light emitting diode 160b, and the light emitting diode 160c are also electrically connected to pads (not shown due to different cross-section) formed on the lower surface 113 of the glass substrate 110 to output signals. Preferably, the light emitting diode 160a, the light emitting diode 160b, and the light emitting diode 160c are, for example, respectively, a red micro light emitting diode, a green micro light emitting diode, and a blue micro light emitting diode, but the disclosure is not limited thereto. So far, the manufacturing of light emitting diode package structure 100a has been completed.

In terms of structure, referring to FIG. 1I, the light emitting diode package structure 100a includes the glass substrate 110, the conductive through holes 120, the active elements E, the insulating layer 140, the light emitting diode 160a, the light emitting diode 160b, the light emitting diode 160c, the pads 132, and the pads 134. The glass substrate 110 has the upper surface 111 and the lower surface 113 opposite to each other. The conductive through holes 120 penetrate the glass substrate 110 and connect the upper surface 111 and the lower surface 113. The active elements E are disposed on the upper surface 111 of the glass substrate 110 and are electrically connected to the conductive through holes 120. The insulating layer 140 is disposed on the upper surface 111 of the glass substrate 110, and covers the active elements E. The light emitting diode 160a, the light emitting diode 160b, and the light emitting diode 160c are disposed on the insulating layer 140 and electrically connected to the active elements E, respectively. The pads 132 and the pads 134 are disposed on the lower surface 113 of the glass substrate 110 and electrically connected to the conductive through holes 120. The source S of the active element E is electrically connected to the corresponding pad 132 directly through the corresponding conductive through hole 120.

More specifically, each active element E includes the gate G, the source S, the gate insulating layer I, the active layer A, and the drain D. The gate G is disposed on the upper surface 111 of the glass substrate 110. The source S is formed on the upper surface 111 of the glass substrate 110, where the gate G and the source S belong to a same layer. The gate insulating layer I is disposed on the upper surface 111 of the glass substrate 110 and covers the gate G. The active layer A is disposed on the upper surface 111 of the glass substrate 110 and covers the gate insulating layer I and part of the source S. The drain D is formed on the active layer A, where the light emitting diode 160a, the light emitting diode 160b, and the light emitting diode 160c are electrically connected to the drain D in each active element E, respectively. It should be noted that the way in which the active elements E and the light emitting diodes 160a, the light emitting diode 160b, and the light emitting diode 160c are electrically connected depends on the polarity of the active element E. Here, the active element E is embodied as a P-type thin film transistor, which is electrically connected to the light emitting diode 160a, the light emitting diode 160b, and the light emitting diode 160c through the drain D. In another embodiment not shown, the active element may also be an N-type thin film transistor, which may be electrically connected to the light emitting diode through the source, which still falls within the scope of the protection intended by the disclosure. The pads 132 and the pads 134 are electrically connected to the source S and the gate G of each active element E through the conductive through holes 120, respectively.

Moreover, the light emitting diode package structure 100a of the present embodiment further includes the patterned circuit layer 152 and the conductive holes 154. The patterned circuit layer 152 is disposed on the insulating layer 140. The conductive holes 154 are disposed in the insulating layer 140 and electrically connect the patterned circuit layer 152 and the drain D of each active element E. The light emitting diode 160a, the light emitting diode 160b, and the light emitting diode 160c are electrically connected to the active elements E through the patterned circuit layer 152 and the conductive holes 154, respectively.

In short, according to the present embodiment, the active element E (i.e. driver circuit) is made on the glass substrate 110 having conductive through holes 120, then the light emitting diode 160a, the light emitting diode 160b, and the light emitting diode 160c are bonded to the active elements E, such that each active element E may control the light emitting diode 160a, light emitting diode 160b, and light emitting diode 160c each having single color, where the source S of the active element E is electrically connected to the corresponding pad 132 directly through the corresponding conductive through hole 120. Since the light emitting diode package structure 100a of the present embodiment has the pads 132 and the pads 134 on the lower surface 113 of the glass substrate 110, so in subsequent applications, it can be directly soldered to other external circuits or of other electronic components through the pads 132 and the pads 134 located under the glass substrate 110.

It must be noted here that the following embodiment uses the component number and part of the content of the aforementioned embodiment, where the same number is used to represent the same or similar components, and the description of the same technique content is omitted. For the omitted description, please refer to the aforementioned embodiment, which will not be repeated in the following embodiments.

Figure 2A:
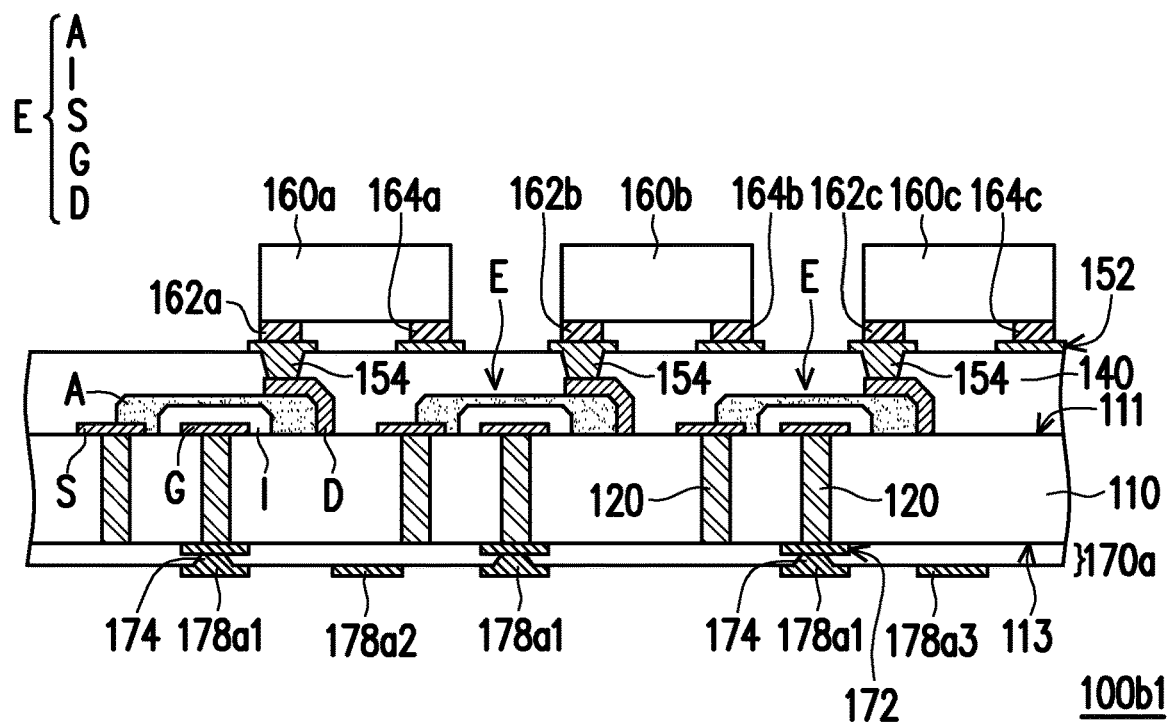
FIG. 2A and FIG. 2B are schematic cross-sectional diagrams of a light emitting diode package structure and a schematic circuit diagram thereof according to another embodiment of the disclosure.
Figure 2B:
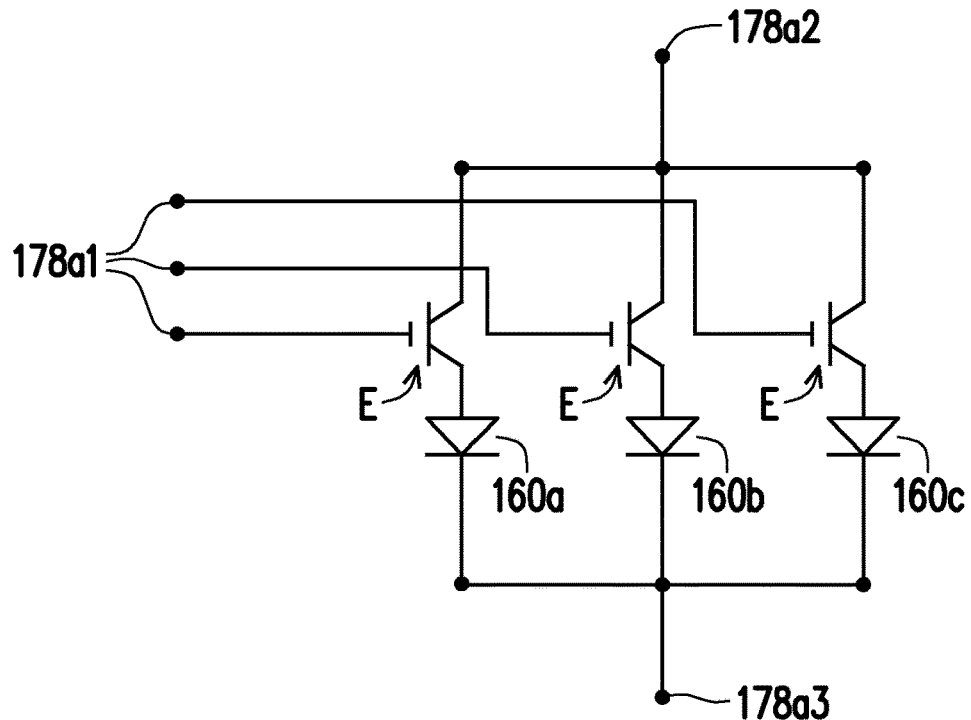

FIG. 2A and FIG. 2B are schematic cross-sectional diagrams of a light emitting diode package structure and a schematic circuit diagram thereof according to another embodiment of the disclosure. First refer to both FIG. 1I and FIG. 2A. The light emitting diode package structure 100b1 of the present embodiment is similar to the above-mentioned light emitting diode package structure 100a. The difference of the two lies in: in the present embodiment, the light emitting diode package structure 100b1 further includes a reconfiguration circuit layer 170a, disposed on the lower surface 113 of the glass substrate 110 and including at least one reconfiguration circuit (a reconfiguration circuit 172 is schematically shown), multiple conductive holes 174, multiple pads 178a1, a pad 178a2, and a pad 178a3. The conductive holes 174 connect the reconfiguration circuit 172 and the pads 178a1. The gate G of each active element E is electrically connected to the pads 178a1 of the reconfiguration circuit layer 170a through the conductive through hole 120 and the conductive hole 174. Referring FIG. 2B, here the pad 178a1 is, for example, a scan line/data line pad, the pad 178a2 is, for example, a ground line pad (i.e. a common source), and the pad 178a3 is, for example, a power line pad (i.e. a common drain).

In short, in the present embodiment, the reconfiguration circuit layer 170a is formed on the lower surface 113 of the glass substrate 110 so as to connect the gate G, the source S, and the drain D of the active element E, which can be used in a control system in which a common cathode and a common anode coexist. Further, with such design, it is possible to input signals to the gate G of the active element E connected to the light emitting diode 160a, the light emitting diode 160b, and the light emitting diode 160c by connecting external control components, so as to adjust and control the current supplied to the light emitting diode 160a, the light emitting diode 160b, and the light emitting diode 160c, such that the light emitting diode 160a, the light emitting diode 160b, and the light emitting diode 160c have functions such as on-off switching, thereby achieving the display function.

Figure 2C:
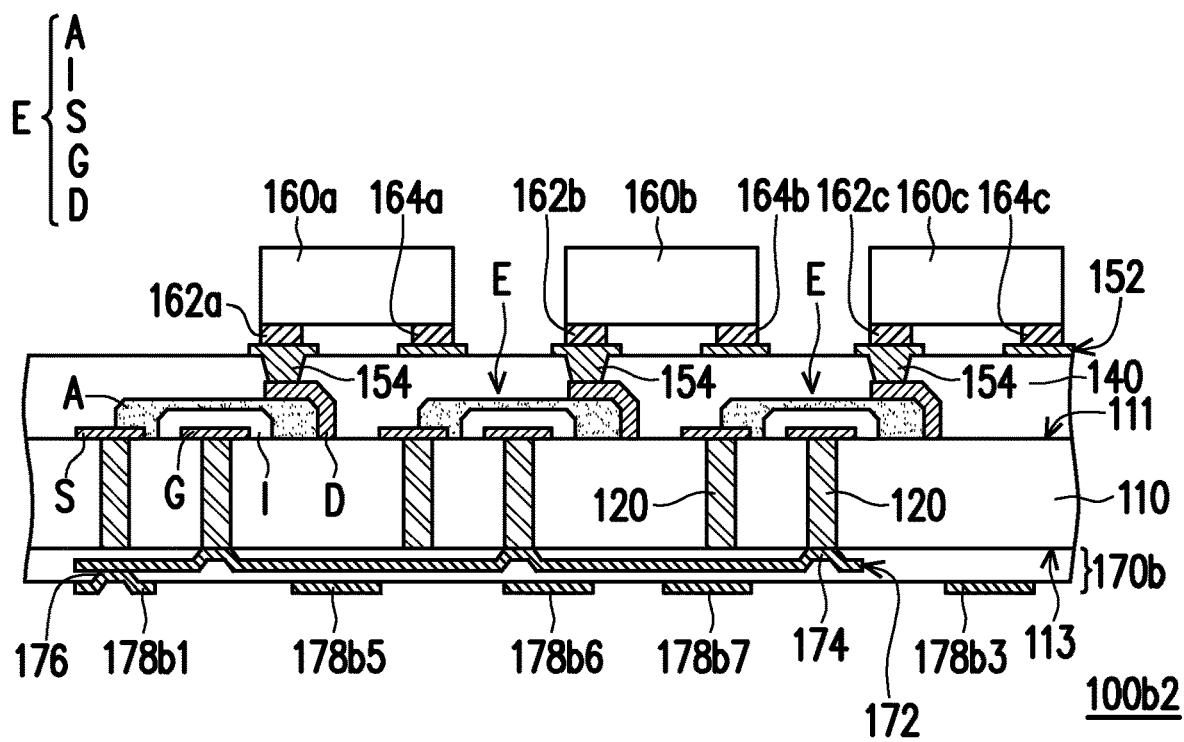
FIG. 2C and FIG. 2D are schematic cross-sectional diagrams of a light emitting diode package structure and a schematic circuit diagram thereof according to yet another embodiment of the disclosure.
Figure 2D:
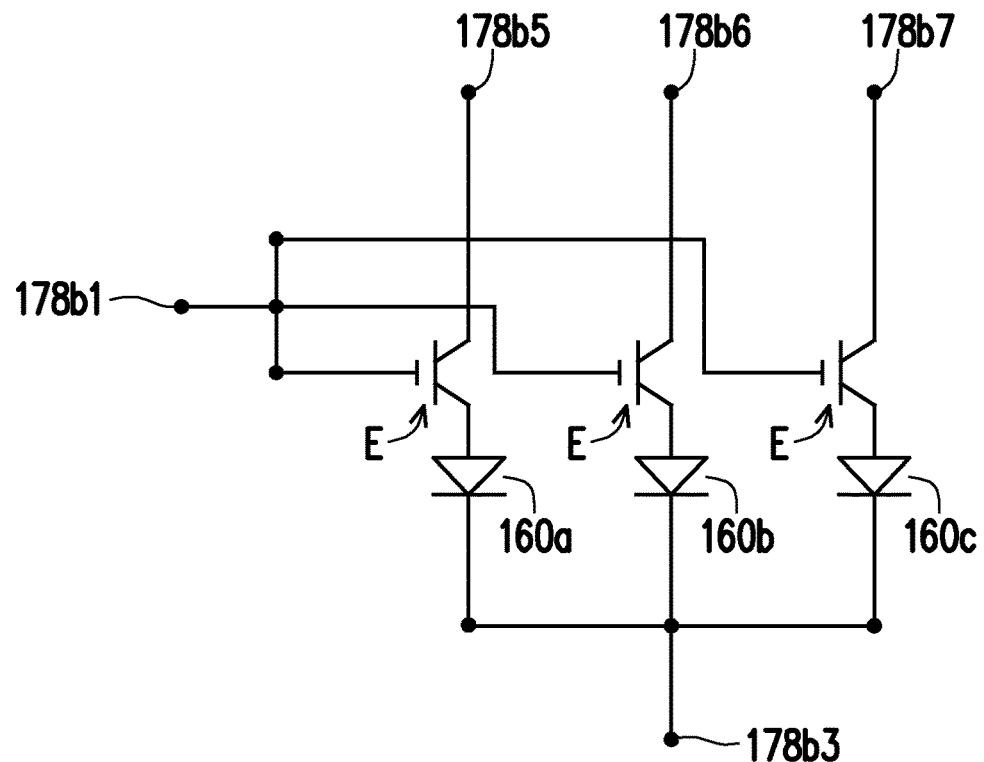

FIG. 2C and FIG. 2D are schematic cross-sectional diagrams of a light emitting diode package structure and a schematic circuit diagram thereof according to yet another embodiment of the disclosure. First please refer to FIG. 1I and FIG. 2C at the same time. A light emitting diode package structure 100b2 of the present embodiment is similar to the above-mentioned light emitting diode package structure 100a. The difference between the two lies in: in the present embodiment, the light emitting diode package structure 100b 2 further includes a reconfiguration circuit layer 170b, disposed on the lower surface3 of the glass substrate 110 and including at least one reconfiguration circuit (a reconfiguration circuit 172 is schematically shown), the multiple conductive holes 174, a conductive hole 176, a pad 178b1, a pad 178b3, a pad 178b5, a pad 178b6, and a pad 178b7. The conductive holes 174 connect the reconfiguration circuit 172 and the conductive through holes 120, and the conductive hole 176 connects the reconfiguration circuit 172 and the pad 178b1. The gate G of each active element E is electrically connected to the pad 178b1 of the reconfiguration circuit layer 170b through the conductive through hole 120 and the conductive hole 174. Referring FIG. 2D, here the pad 178b1 is, for example, a scan line/data line pad (i.e. a common gate), the pad 178b3 is, for example, a power line pad (i.e. a common drain), and the pad 178b5, the pad 178b6, and the pad 178b7 are respectively input terminals of the light emitting diode 160a, the light emitting diode 160b, and the light emitting diode 160c.

In short, in the present embodiment, the reconfiguration circuit layer 170b is formed on the lower surface 113 of the glass substrate 110 so as to connect the gate G, the source S, and the drain D of the active element E. Such design is a common cathode control system. For anode part, the signal is input by three terminals (i.e. the pad 178b5, the pad 178b6, and the pad 178b7).

With different external voltage supplies, the on-off switching of the light emitting diode 160a, the light emitting diode 160b, and the light emitting diode 160c can be controlled to achieve the display function.

Figure 2E:
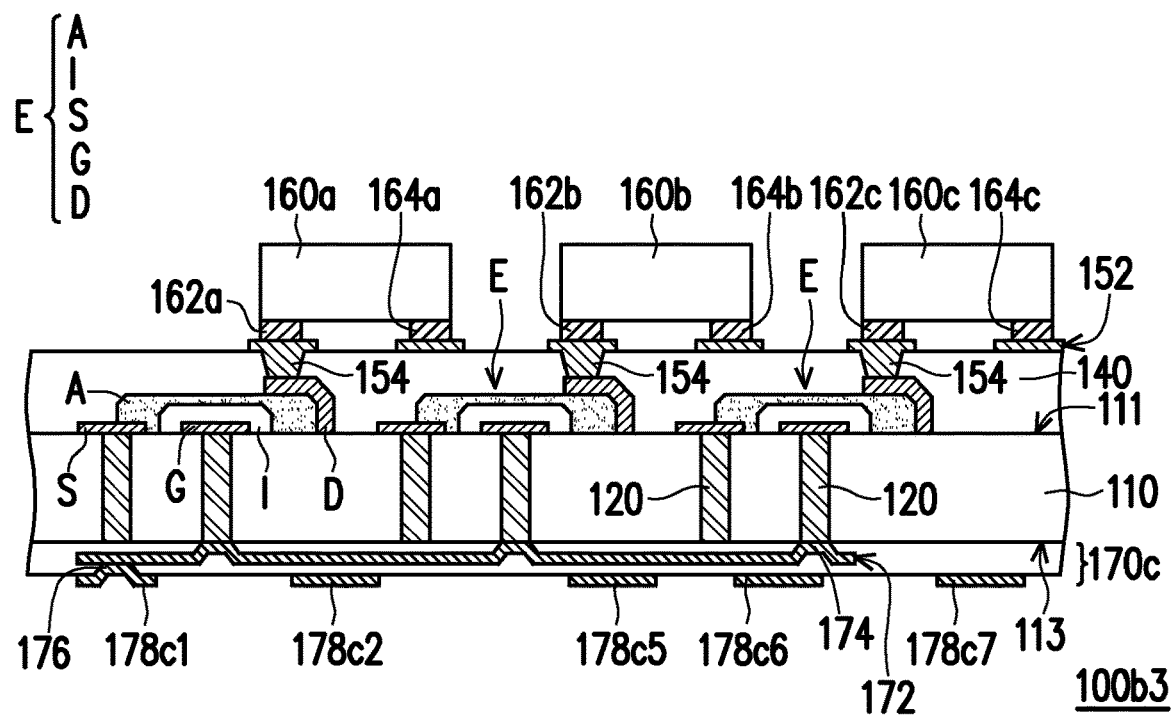
FIG. 2E and FIG. 2F are schematic cross-sectional diagrams of a light emitting diode package structure and a schematic circuit diagram thereof according to still another embodiment of the disclosure.
Figure 2F:
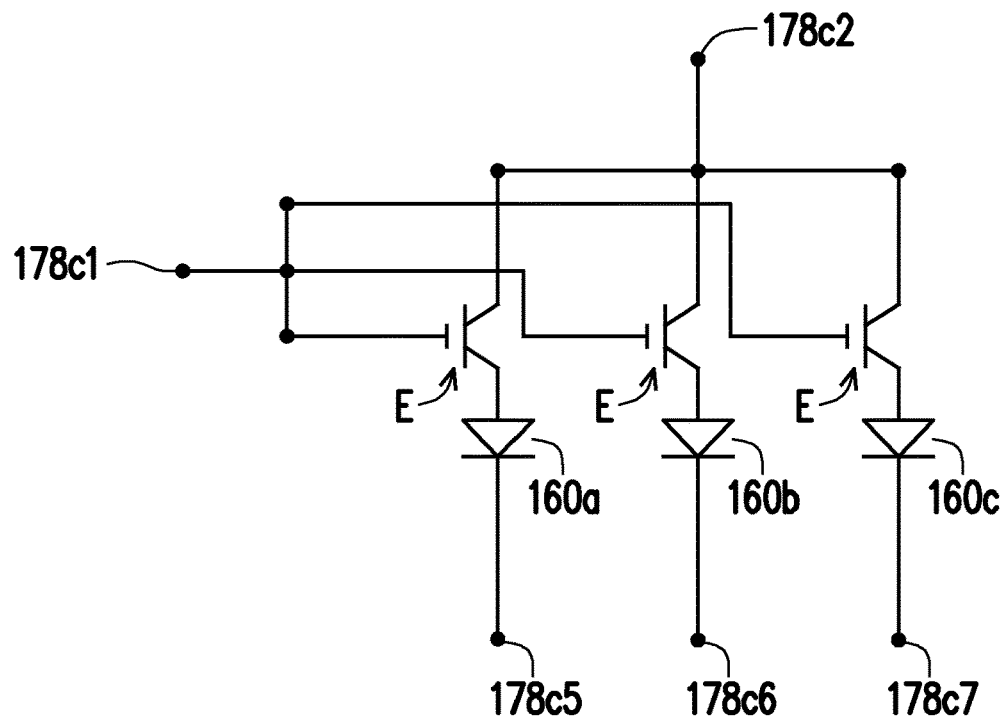

FIG. 2E and FIG. 2F are schematic cross-sectional diagrams of a light emitting diode package structure and a schematic circuit diagram thereof according to still another embodiment of the disclosure. First please refer to FIG. 1I and FIG. 2F at the same time. A light emitting diode package structure 100b3 of the present embodiment is similar to the above-mentioned light emitting diode package structure 100a. The difference between the two lies in: in the present embodiment, the light emitting diode package structure 100b3 further includes a reconfiguration circuit layer 170c, disposed on the lower surface 113 of the glass substrate 110 and including at least one reconfiguration circuit (a reconfiguration circuit 172 is schematically shown), the multiple conductive holes 174, the conductive hole 176, a pad 178c1, a pad 178c2, a pad 178c5, a pad 178c6, and a pad 178c7. The conductive holes 174 connect the reconfiguration circuit 172 and the conductive through holes 120, and the conductive hole 176 connects the reconfiguration circuit 172 and the pad 178c1. The gate G of each active element E is electrically connected to the pad 178c1 of the reconfiguration circuit layer 170c through the conductive through hole 120 and the conductive hole 174. Referring FIG. 2F, here the pad 178c1 is, for example, a scan line/data line pad (i.e. a common gate), the pad 178c2 is, for example, a ground line pad (i.e. a common source), and the pad 178c5, the pad 178c6, and the pad 178c7 are respectively output terminals of the light emitting diode 160a, the light emitting diode 160b, and the light emitting diode 160c.

In short, in the present embodiment, the reconfiguration circuit layer 170c is formed on the lower surface 113 of the glass substrate 110 so as to connect the gate G, the source S, and the drain D of the active element E. Such design is a common anode control system, in which the external voltage is supplied to the anode. For cathode part, the signal is input by three terminals (i.e. the pad 178c5, the pad 178c6, and the pad 178c7). The rear terminal of the cathode is connected in series with resistors; by switching the resistors to control partial voltage, the light emitting diode 160a, the light emitting diode 160b, and the light emitting diode 160c have functions such as on/off switching, respectively, so as to achieve the display function.

Figure 2G:
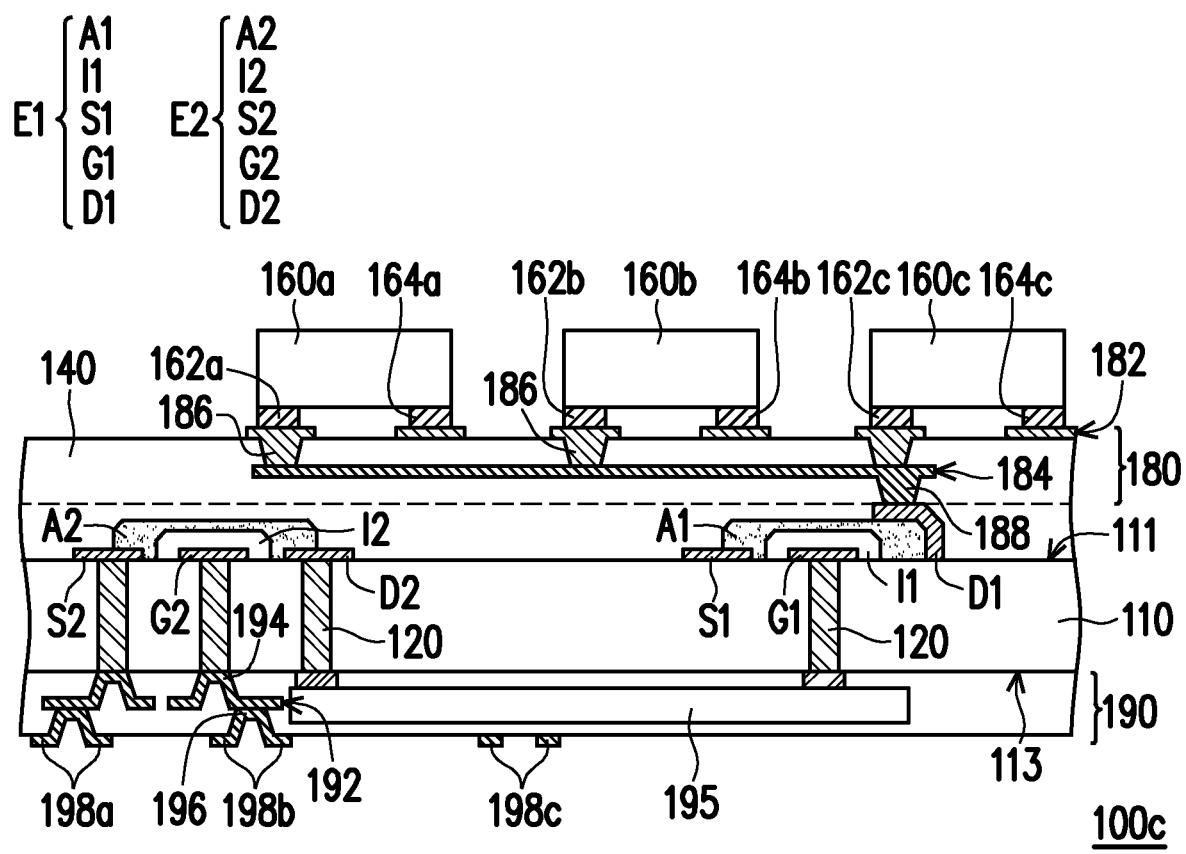
FIG. 2G is a schematic cross-sectional diagram of a light emitting diode package structure according to yet still another embodiment of the disclosure.

FIG. 2G is a schematic cross-sectional diagram of a light emitting diode package structure according to yet still another embodiment of the disclosure. First please refer to FIG. 1I and FIG. 2G at the same time. A light emitting diode package structure 100c of the present embodiment is similar to the above-mentioned light emitting diode package structure 100a. The difference between the two lies in: in an embodiment of the disclosure, the active elements include a first active element E1 and a second active element E2. The first active element E1 includes a first gate G1, a first source S1, a first active layer A1, a first gate insulating layer I1, and a first drain D1. The first gate G1, the first source S1, the first active layer A1, and the first gate insulating layer I1 are disposed on the upper surface 111 of the glass substrate 110. The first gate G1 and the first source S1 belong to a same layer. The first gate insulating layer I1 covers the first gate G1, the first active layer A1 covers the first gate insulating layer I1 and part of the first source S1, and the first drain D1 is disposed on the first active layer A1.

Moreover, the second active element E2 includes a second gate G2, a source S2, a second active layer A2, a second gate insulating layer 12, and a second drain D2. The second gate G2, the source S2, the second active layer A2, the second gate insulating layer 12, and the second drain D2 are disposed on the upper surface 111 of the glass substrate 110. The second gate G2, the source S2, and the second drain D2 belong to a same layer. The second gate insulating layer 12 covers the second gate G2, and the second active layer A2 covers the second gate insulating layer 12, part of the source S2, and part of the second drain D2. The conductive through holes 120 are electrically connected to the first gate G1 of the first active element E1, the second gate G2 of the second active element E2, the source S2, and the second drain D2.

Then, referring to both FIG. 1G and FIG. 2G, a first reconfiguration circuit layer 180 is formed on the insulating layer 140 after forming the insulating layer 140 and before providing the light emitting diode 160a, the light emitting diode 160b, and the light emitting diode 160c. The first reconfiguration circuit layer 180 includes multiple reconfiguration circuits 182 and a first reconfiguration circuit 184 and multiple conductive holes 186 and a conductive hole 188, where the conductive holes 186 electrically connect the reconfiguration circuits 182 and the first reconfiguration circuit 184, and the conductive hole 188 electrically connects the reconfiguration circuits 182 and the first drain D1 of the first active element E1. That is, the light emitting diode 160a, the light emitting diode 160b, and the light emitting diode 160c are electrically connected to the first drain D1 of the first active element E1 through the first reconfiguration circuit layer 180. In other words, the light emitting diode 160a, the light emitting diode 160b, and the light emitting diode 160c are electrically connected to at least one of the multiple active elements E.

Moreover, the light emitting diode package structure 100c of the disclosure further includes forming a second reconfiguration circuit layer 190 on the lower surface 113 of the glass substrate 110. The second reconfiguration circuit layer 190 includes at least one reconfiguration circuit 192, multiple conductive holes 194, multiple conductive holes 196, a pad 198a, a pad 198b, and a pad 198c. The conductive holes 194 connect the reconfiguration circuit 192 and the conductive through holes 120, and the conductive holes 196 connect the reconfiguration circuit 192 and the pad 198a, 198b. The second gate G2 and the source S2 of the second active element E2 are electrically connected to the pad 198a and the pad 198b of the second reconfiguration circuit layer 190 through the conductive through holes 120. In other words, in the present embodiment, the source S2 of at least one active element (i.e. the second active element E2) is electrically connected to the corresponding pad 198a directly through the corresponding conductive through hole 120. Here, the pad 198a is, for example, a scan line/data line pad, the pad 198b is, for example, a ground line pad, and the pad 198c is, for example, a power line pad.

Furthermore, the light emitting diode package structure 100c of the present embodiment further includes a passive element 195 embedded in the second reconfiguration circuit layer 190, where the passive element 195 is, for example, a capacitance, but the disclosure is not limited thereto. The conductive through holes 120 connecting the first gate G1 of the first active element E1 and connecting the second drain D2 of the second active element E2 are electrically connected to the passive element 195.

In short, in the present embodiment, two active elements (i.e. the first active element E1 and the second active element E2) and a passive element 195 are configured as the driver circuit on the glass substrate 110 so as to simultaneously control the three light emitting diode 160a, the light emitting diode 160b, and the light emitting diode 160c, namely the color of a pixel. Of course, in other embodiments not shown, the number of active elements and the number of passive elements may be adjusted according to requirements, for example, five active elements with two passive elements, which still falls within the scope of the protection intended by the disclosure.

Figure 3A:
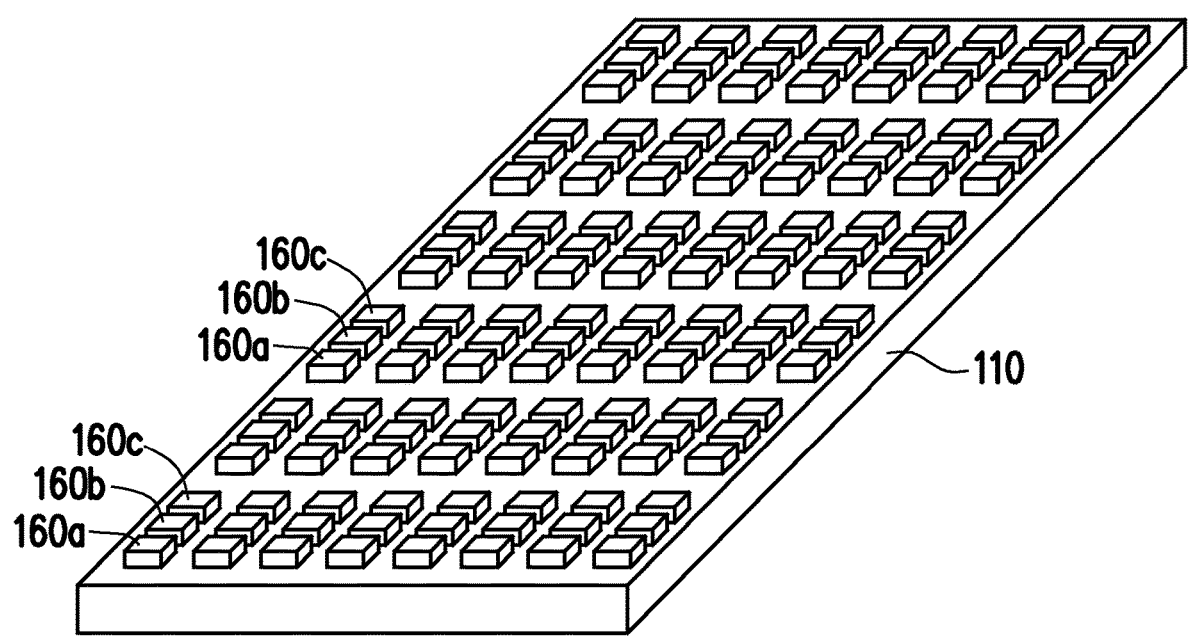
FIG. 3A to FIG. 3D are cross-sectional diagrams of a manufacturing method of display device according to an embodiment of the disclosure.
Figure 3B:
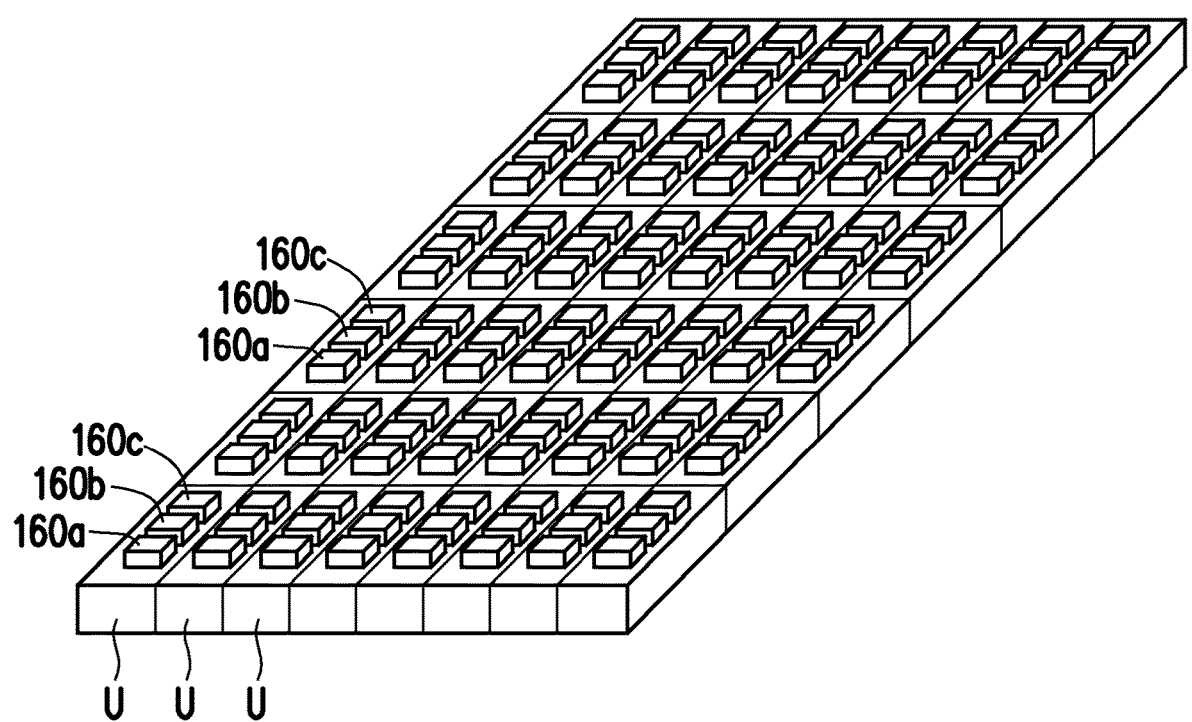
Figure 3C:
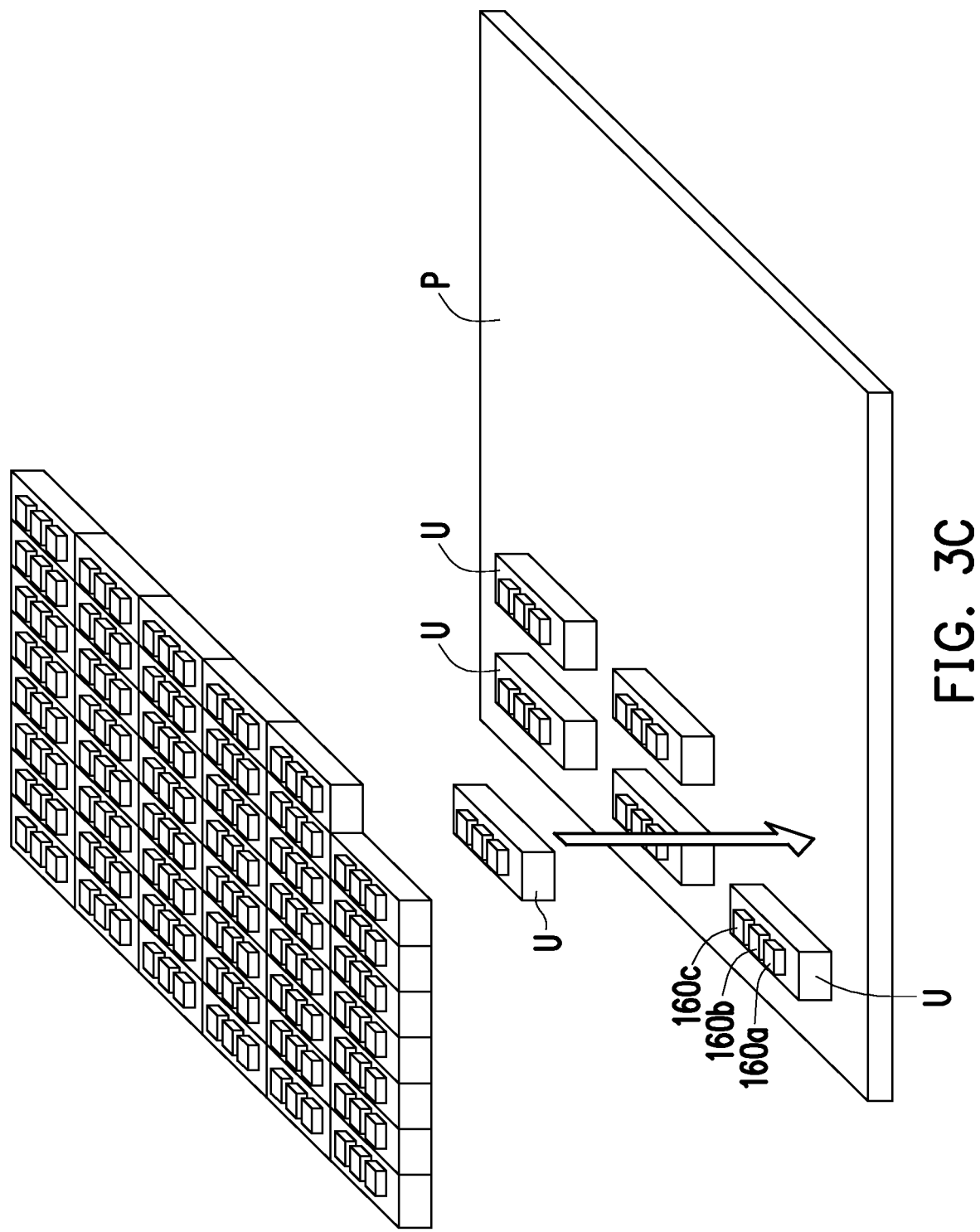
Figure 3D:
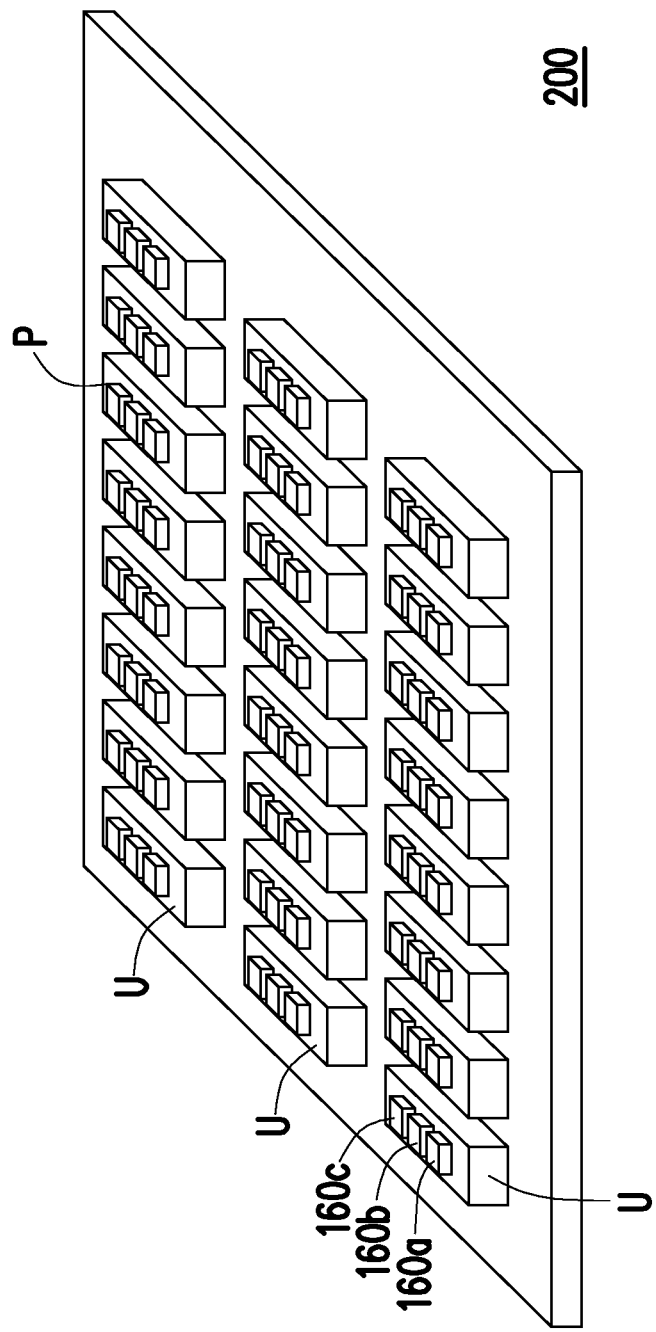

FIG. 3A to FIG. 3D are a cross-sectional diagrams of a manufacturing method of display device according to an embodiment of the disclosure, where FIG. 1I is a partial cross-sectional diagram of FIG. 3A. First, referring to FIG. 1I and FIG. 3A, the light emitting diode 160a, the light emitting diode 160b, and the light emitting diode 160c are bonded on the glass substrate 110 after manufacturing the light emitting diode package structure 100a. Next, referring to FIG. 3B, the light emitting diode package structure 100a is singulated so as to form multiple independent light emitting diode package units U. Here, the number of light emitting diode 160a, the light emitting diode 160b, and the light emitting diode 160c in each light emitting diode package unit U is three, where the light emitting diode 160a, the light emitting diode 160b, and the light emitting diode 160c are respectively a red light emitting diode, a green light emitting diode, and a blue light emitting diode. Next, the singulated small-sized light emitting diode package unit U is inspected so as to pass the yield verification. Then, referring to FIG. 3C and FIG. 3D, a carrier board P is provided, and the light emitting diode package units U having passed the yield verification are assembled on the carrier board P so as to form a display device 200, where each light emitting diode package unit U is directly electrically connected to the carrier board P through the pads 132 and the pads 134 (see FIG. 1I). Here, the carrier board P is, for example, a large-sized logic circuit board, but the disclosure is not limited thereto. So far, the manufacturing of the display device 200 has been completed.

In short, in the present embodiment, a small-sized light emitting diode package unit U with the pads 132 and the pads 134 is formed by first singulating the light emitting diode package structure 100a. Then, according to the required dimension, a certain number of light emitting diode package unit U having passed yield verification are directly electrically connected to the carrier board P through the pads 132 and the pads 134, so as to complete the manufacturing of the final display device 200. Compared with the conventional technology in which a large-sized thin-film transistor substrate and the micro light emitting diodes transferred thereon by means of mass transfer are spliced onto the circuit board, in the present embodiment, the singulated small-sized light emitting diode package unit U is spliced onto the carrier board P, therefore there is no problem of substrate warping, and the splicing yield can be improved. In addition, if there is damage and need to be repaired, the damaged light emitting diode package unit U can be directly replaced with a good light emitting diode package unit U, which is a relatively simple process, and the manufacturing cost can be reduced.

In summary, in the light emitting diode package structure and manufacturing method thereof according to the disclosure, the multiple conductive through holes penetrate the glass substrate and are electrically connect the multiple active elements on the upper surface and the multiple pads on the lower surface, where the source of at least one of the multiple active element is electrically connected to the multiple corresponding pads through the multiple corresponding conductive directly through hole, and the multiple light emitting diodes are electrically connected to the multiple active elements. In this way, the multiple independent light emitting diode package units are formed having the multiple pads by subsequently singulating the light emitting diode package structure. Also, each of the multiple light emitting diode package units can be directly electrically connected to the carrier board through the multiple pads, so as to complete the manufacturing of the display device. Compared with the conventional technology in which a large-sized thin-film transistor substrate and the micro light emitting diodes transferred thereon by means of mass transfer are spliced onto the circuit board, in the disclosure, the singulated small-sized light emitting diode package unit is spliced onto the carrier board, therefore there is no problem of substrate warping. In addition, if there is damage and need to be repaired, the damaged light emitting diode package unit can be directly replaced with a good light emitting diode package unit, which is a relatively simple process, and the manufacturing cost can be reduced.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode package structure, comprising:
a glass substrate, having an upper surface and a lower surface opposite to each other;
a plurality of conductive through holes, penetrating the glass substrate and connecting the upper surface and the lower surface;
a plurality of active elements, disposed on the upper surface of the glass substrate and electrically connected to the plurality of conductive through holes;
an insulating layer, disposed on the upper surface of the glass substrate and covering the plurality of active elements;
a plurality of light emitting diodes, disposed on the insulating layer and electrically connected to at least one of the plurality of active elements; and
a plurality of pads, disposed on the lower surface of the glass substrate and electrically connected to the plurality of conductive through holes, wherein a source of the at least one of the plurality of active elements is electrically connected to at least one of the plurality of corresponding pads directly through the corresponding conductive through hole.

2. The light emitting diode package structure as described in claim 1, wherein each of the plurality of active elements comprises:
a gate, disposed on the upper surface of the glass substrate;
the source, disposed on the upper surface of the glass substrate, wherein the gate and the source belong to a same layer;
a gate insulating layer, disposed on the upper surface of the glass substrate and covering the gate;
an active layer, disposed on the upper surface of the glass substrate and covering the gate insulating layer and part of the source; and
a drain, disposed on the active layer, wherein the plurality of light emitting diodes are electrically connected, respectively, to the drain of each of the plurality of active elements.

3. The light emitting diode package structure as described in claim 2, wherein the plurality of pads are electrically connected to the source and the gate of each of the plurality of active elements through the plurality of conductive through holes.

4. The light emitting diode package structure as described in claim 2, further comprising:
a reconfiguration circuit layer, disposed on the lower surface of the glass substrate and comprising at least one reconfiguration circuit, a plurality of conductive holes and the plurality of pads, wherein the plurality of conductive holes connect the at least one reconfiguration circuit and the plurality of conductive through holes and connect the at least one reconfiguration circuit and the plurality of pads, wherein the gate of each of the plurality of active elements is electrically connected to the plurality of pads of the reconfiguration circuit layer through the plurality of conductive through holes.

5. The light emitting diode package structure as described in claim 2, further comprising:
a patterned circuit layer, disposed on the insulating layer; and
a plurality of conductive holes, disposed in the insulating layer and electrically connecting the patterned circuit layer and the drain of each of the plurality of active elements, wherein the plurality of light emitting diodes are electrically connected, respectively, to the plurality of active elements through the patterned circuit layer and the plurality of conductive holes.

6. The light emitting diode package structure as described in claim 1, wherein the plurality of active elements comprise a first active element and a second active element,
wherein the first active element comprises a first gate, a first source, a first active layer, a first gate insulating layer, and a first drain, wherein the first gate, the first source, the first active layer, and the first gate insulating layer are disposed on the upper surface of the glass substrate, the first gate and the first source belong to a same layer, the first gate insulating layer covers the first gate, the first active layer covers the first gate insulating layer and part of the first source, and the first drain is disposed on the first active layer;

the second active element comprises a second gate, the source, a second active layer, a second gate insulating layer, and a second drain, wherein the second gate, the source, the second active layer, the second gate insulating layer, and the second drain are disposed on the upper surface of the glass substrate, the second gate, the source, and the second drain belong to a same layer, the second gate insulating layer covers the second gate, and the second active layer covers the second gate insulating layer, part of the source, and part of the second drain; and the plurality of conductive through holes are electrically connected to the first gate of the first active element, the second gate of the second active element, the source, and the second drain.

7. The light emitting diode package structure as described in claim 6, further comprising:
a first reconfiguration circuit layer, disposed on the insulating layer, wherein the plurality of light emitting diodes are electrically connected to the first drain of the first active element through the first reconfiguration circuit layer.

8. The light emitting diode package structure as described in claim 7, further comprising:
a second reconfiguration circuit layer, disposed on the lower surface of the glass substrate and comprising the at least one reconfiguration circuit, a plurality of conductive holes, and the plurality of pads, wherein the plurality of conductive holes connect the at least one reconfiguration circuit and the plurality of conductive through holes and connect the at least one reconfiguration circuit and the plurality of pads, wherein the second gate of the second active element and the source are electrically connected to the plurality of pads of the second reconfiguration circuit layer through the plurality of conductive through holes.

9. The light emitting diode package structure as described in claim 8, further comprising:
a passive element, embedded in the second reconfiguration circuit layer, wherein the plurality of conductive through holes connecting the first gate of the first active element and connecting the second drain of the second active element are electrically connected to the passive element.

10. A manufacturing method of light emitting diode package structure, the manufacturing method comprising:
providing a glass substrate, the glass substrate having an upper surface and a lower surface opposite to each other;
forming a plurality of conductive through holes penetrating the glass substrate, the plurality of conductive through holes connecting the upper surface and the lower surface;
forming a plurality of active elements on the upper surface of the glass substrate, the plurality of active elements electrically connected to the plurality of conductive through holes;
forming an insulating layer on the upper surface of the glass substrate, the insulating layer covering the plurality of active elements;
bonding a plurality of light emitting diodes on the insulating layer, the plurality of light emitting diodes electrically connected to at least one of the plurality of active elements; and forming a plurality of pads on the lower surface of the glass substrate, the plurality of pads electrically connected to the plurality of conductive through holes, wherein a source of the at least one of the plurality of active elements is electrically connected to at least one of the plurality of corresponding pads directly through the corresponding conductive through hole.

11. The manufacturing method of light emitting diode package structure as described in claim 10, wherein steps of forming each of the plurality of active elements on the upper surface of the glass substrate comprise:
forming a gate and the source on the upper surface of the glass substrate, wherein the gate and the source belong to a same layer;
forming a gate insulating layer on the upper surface of the glass substrate, the gate insulating layer covering the gate;
forming an active layer on the upper surface of the glass substrate, the active layer covering the gate insulating layer and part of the source; and
forming a drain on the active layer, wherein the plurality of light emitting diodes are electrically connected, respectively, to the drain of each of the plurality of active elements.

12. The manufacturing method of light emitting diode package structure as described in claim 11, wherein the plurality of pads are formed on the lower surface of the glass substrate at the same time when forming the gate and the source, and the plurality of pads are electrically connected to the source and the gate of each of the plurality of active elements through the plurality of conductive through holes.

13. The manufacturing method of light emitting diode package structure as described in claim 11, further comprising:
forming a reconfiguration circuit layer on the lower surface of the glass substrate, the reconfiguration circuit layer comprising at least one reconfiguration circuit, a plurality of conductive holes and the plurality of pads, wherein the plurality of conductive holes connect the at least one reconfiguration circuit and the plurality of conductive through holes and connect the at least one reconfiguration circuit and the plurality of pads, wherein the gate of each of the plurality of active elements is electrically connected to the plurality of pads of the reconfiguration circuit layer through the plurality of conductive through holes.

14. The manufacturing method of light emitting diode package structure as described in claim 11, wherein after forming the insulating layer and before providing the plurality of light emitting diodes further comprising:
forming a patterned circuit layer and a plurality of conductive holes, wherein the patterned circuit layer is disposed on the insulating layer, and the plurality of conductive holes are disposed in the insulating layer and electrically connect the patterned circuit layer and the drain of each of the plurality of active elements, wherein the plurality of light emitting diodes are electrically connected, respectively, to the plurality of active elements through the patterned circuit layer and the plurality of conductive holes.

15. The manufacturing method of light emitting diode package structure as described in claim 10, wherein the plurality of active elements comprise a first active element and a second active element,
the first active element comprises a first gate, a first source, a first active layer, a first gate insulating layer, and a first drain, wherein the first gate, the first source, the first active layer, and the first gate insulating layer are disposed on the upper surface of the glass substrate, the first gate and the first source belong to a same layer, the first gate insulating layer covers the first gate, the first active layer covers the first gate insulating layer and part of the first source, and the first drain is disposed on the first active layer;

the second active element comprises a second gate, the source, a second active layer, a second gate insulating layer, and a second drain, wherein the second gate, the source, the second active layer, the second gate insulating layer, and the second drain are disposed on the upper surface of the glass substrate, the second gate, the source, and the second drain belong to a same layer, the second gate insulating layer covers the second gate, and the second active layer covers the second gate insulating layer, part of the source, and part of the second drain; and the plurality of conductive through holes are electrically connected to the first gate of the first active element, the second gate of the second active element, the source, and the second drain.

16. The manufacturing method of light emitting diode package structure as described in claim 15, further comprising:

forming a first reconfiguration circuit layer on the insulating layer after forming the insulating layer and before providing the plurality of light emitting diodes, wherein the plurality of light emitting diodes are electrically connected to the first drain of the first active element through the first reconfiguration circuit layer.

17. The manufacturing method of light emitting diode package structure as described in claim 16, further comprising:

forming a second reconfiguration circuit layer on the lower surface of the glass substrate, the second reconfiguration circuit layer comprising at least one reconfiguration circuit, a plurality of conductive holes, and the plurality of pads, wherein the plurality of conductive holes connect the at least one reconfiguration circuit and the plurality of conductive through holes and connect the at least one reconfiguration circuit and the plurality of pads, wherein the second gate of the second active element and the source are electrically connected to the plurality of pads of the second reconfiguration circuit layer through the plurality of conductive through holes.

18. The manufacturing method of light emitting diode package structure as described in claim 17, further comprising:

embedding a passive element in the second reconfiguration circuit layer, wherein the plurality of conductive through holes connecting the first gate of the first active element and connecting the second drain of the second active element are electrically connected to the passive element.

19. A manufacturing method of display device, the manufacturing method comprising:

providing a carrier board; and providing a light emitting diode package structure, the light emitting diode package structure comprising:

a glass substrate, having an upper surface and a lower surface opposite to each other;

a plurality of conductive through holes, penetrating the glass substrate and connecting the upper surface and the lower surface;

a plurality of active elements, disposed on the upper surface of the glass substrate and electrically connected to the plurality of conductive through holes;

an insulating layer, disposed on the upper surface of the glass substrate and covering the plurality of active elements;

a plurality of light emitting diodes, disposed on the insulating layer and electrically connected to at least one of the plurality of active elements; and a plurality of pads, disposed on the lower surface of the glass substrate and electrically connected to the plurality of conductive through holes, wherein a source of the at least one of the plurality of active elements is electrically connected to at least one of the plurality of corresponding pads directly through the corresponding conductive through hole;

singulating the light emitting diode package structure so as to form a plurality of independent light emitting diode package units; and assembling the plurality of light emitting diode package units on the carrier board so as to form a display device, wherein each of the plurality of light emitting diode package units is directly electrically connected to the carrier board through the plurality of pads.

20. The manufacturing method of display device as described in claim 19, wherein the number of the plurality of light emitting diodes in each of the plurality of light emitting diode package units is three, and the plurality of light emitting diodes are a red micro light emitting diode, a green micro light emitting diode, and a blue micro light emitting diode.

* * * * *